US010801981B2

(12) United States Patent
Xu et al.

(10) Patent No.: US 10,801,981 B2
(45) Date of Patent: Oct. 13, 2020

(54) GAS SENSOR, SENSOR ARRAY, AND MANUFACTURING METHOD THEREOF

(71) Applicant: HEFEI MICRO NANO SENSING TECHNOLOGY CO., LTD., Hefei (CN)

(72) Inventors: Lei Xu, Hefei (CN); Shufeng Peng, Hefei (CN); Dongcheng Xie, Hefei (CN); Ruiying Zhou, Hefei (CN)

(73) Assignee: HEFEI MICRO NANO SENSING TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 16/482,287

(22) PCT Filed: Dec. 12, 2018

(86) PCT No.: PCT/CN2018/120547
§ 371 (c)(1),
(2) Date: Jul. 31, 2019

(87) PCT Pub. No.: WO2019/214228
PCT Pub. Date: Nov. 14, 2019

(65) Prior Publication Data
US 2020/0225180 A1 Jul. 16, 2020

(30) Foreign Application Priority Data

May 11, 2018 (CN) .......................... 2018 1 0447478

(51) Int. Cl.
*G01N 27/12* (2006.01)
*B81B 3/00* (2006.01)
*B81C 1/00* (2006.01)

(52) U.S. Cl.
CPC ......... *G01N 27/123* (2013.01); *B81B 3/0037* (2013.01); *B81C 1/0015* (2013.01);
(Continued)

(58) Field of Classification Search
CPC ................ G01N 27/123; B81B 3/0037; B81C 2201/0105; B81C 2201/0133; B81C 2201/0176; B81C 1/0015
See application file for complete search history.

(56) References Cited

U.S. PATENT DOCUMENTS

2002/0142478 A1 10/2002 Wado et al.

FOREIGN PATENT DOCUMENTS

| CN | 102359980 A | 2/2012 |
|---|---|---|
| CN | 205449859 U | 8/2016 |

(Continued)

*Primary Examiner* — Daniel S Larkin
(74) *Attorney, Agent, or Firm* — Bayramoglu Law Offices LLC

(57) ABSTRACT

A gas sensor includes a silicon substrate, a detecting electrode, a first isolation film, a heating resistor, and a second isolation film that are successively stacked. The gas sensor has a base structure and a cantilever structure with a curled free end, and a gas sensitive material is provided on the end of the cantilever structure. A sensor array composed of the gas sensor, and a method for manufacturing the gas sensor are also provided. The method includes (1) selecting a sacrificial layer; (2) preparing a detecting electrode; (3) preparing a first isolation film; (4) preparing a heating resistor; (5) preparing a second isolation film; (6) releasing the membrane; and (7) loading the gas sensitive material.

20 Claims, 7 Drawing Sheets

(52) U.S. Cl.
CPC .............. *B81B 2201/0214* (2013.01); *B81B 2203/0118* (2013.01); *B81B 2203/04* (2013.01); *B81C 2201/0105* (2013.01); *B81C 2201/0132* (2013.01); *B81C 2201/0133* (2013.01); *B81C 2201/0176* (2013.01)

(56) References Cited

FOREIGN PATENT DOCUMENTS

| | | |
|---|---|---|
| CN | 205449863 U | 8/2016 |
| CN | 108519408 A | 9/2018 |

GAS SENSOR, SENSOR ARRAY, AND MANUFACTURING METHOD THEREOF

CROSS REFERENCE TO THE RELATED APPLICATIONS

This application is the national phase entry of International Application No. PCT/CN2018/120547, filed on Dec. 12, 2018, which is based upon and claims priority to Chinese Patent Application No. 201810447478.7, filed on May 11, 2018, the entire contents of which are incorporated herein by reference.

TECHNICAL FIELD

The present invention belongs to the technical field of microelectronic mechanical systems and gas detection, and particularly relates to a gas sensor, a preparation method thereof, and a sensor array.

BACKGROUND

Gas sensors based on the technique of microelectronic mechanical system (MEMS) have gradually shown a great application potential owing to their small size, low power consumption, high sensitivity, fast response, etc., and are expected to replace the gas sensors based on traditional techniques, and are widely used in the fields of Internet of Things (IoTs), mobile terminals, and artificial intelligence (AI), etc. Moreover, among those MEMS gas sensors, sensors which use the metal oxide semiconductor (MOS) material have wider detection ranges and would have broader market space in the large-scale applications in the future.

The existing MEMS MOS gas sensors are mainly based on the research of suspended-membrane-type microheaters. The sensors of this structure have a relatively lower power consumption, generally as low as 20 milliwatts. For example, the Chinese utility model patent NO. 201520759054.6 (application number) discloses a resistive gas sensor having a four-supporting-cantilever four-layer structure which includes a silicon substrate frame, a heating film layer, a heating electrode layer, and a sensitive film layer. The silicon substrate frame, heating film layer, heating electrode layer, and sensitive film layer are arranged from bottom to top in order. Further, the heating film layer includes a heating film zone which is connected to the silicon substrate frame by four cantilevers. In another example, Chinese utility model patent NO. 201520759055.0 discloses a resistive gas sensor having a two-supporting-cantilever and four-layer structure which also includes a silicon substrate frame, a heating film layer, a heating electrode layer, and a sensitive film layer. The silicon substrate frame, heating film layer, heating electrode layer, and sensitive film layer are arranged from bottom to top in order. Further, the heating film layer includes a heating film zone which is connected to the silicon substrate frame by two cantilevers. Although having lower power consumption, these multi-cantilever-type gas sensors can no longer meet the needs with the rapid development of the applications of mobile terminal and Internet of Things. Moreover, in the manufacturing of these multi-cantilever-type gas sensors, there are problems of complicated process, difficult positioning, and low efficiency.

SUMMARY

The technical problem to be solved by the present invention is how to further reduce the power consumption of the cantilever-type gas sensors.

The present invention solves the above technical problem by using the following technical solutions.

A gas sensor having a base structure and a cantilever structure, includes the following parts that are successively stacked:

a silicon substrate;

a detecting electrode, wherein the detecting electrode includes a first base part, one side of the first base part is provided with a first cantilever warped upward, and a free end of the first cantilever is provided with a first curled part; a first window is provided on a side of the first base part away from the first cantilever, a second window is provided on the first cantilever, the second window extends along the first cantilever to the first curled part, and the first curled part is divided by the second window; the second window is interconnected with the first window, and the detecting electrode is divided into two parts by the first window and the second window; first lead wires are respectively provided on the first base part at positions on both sides of the first window;

a first isolation film, wherein the first isolation film is a silicon nitride layer and includes a second base part, one side of the second base part is provided with a second cantilever warped upward, and the free end of the second cantilever is provided with a second curled part; a first through hole is provided on the second base part at positions corresponding to the first lead wires, and the first lead wires pass through the corresponding first through hole and is exposed outside;

a heating resistor, wherein the heating resistor includes a third base part, one side of the third base part is provided with a third cantilever warped upward, and the free end of the third cantilever is provided with a third curled part; a third window is provided on a side of the third base part away from the third cantilever, a fourth window is provided on the third cantilever, the fourth window extends along the third cantilever to the third curled part, and the fourth window is interconnected with the third window; second lead wires are respectively provided on the third base part at positions on both sides of the third window; the thickness of the heating resistor is smaller than the thickness of the first isolation film, and the heating resistor does not cover the first base part; and a second isolation film, wherein the second isolation film is a silicon nitride layer and includes a fourth base part, wherein, one side of the fourth base part is provided with a fourth cantilever warped upward, and the free end of the fourth cantilever is provided with a fourth curled part; a second through hole is provided on the fourth base part at a position corresponding to the second lead wires; and the fourth base part does not cover the first through hole;

wherein, the first base part, the second base part, the third base part, and the fourth base part form the base structure; the first cantilever, the second cantilever, the third cantilever, and the fourth cantilever form the cantilever structure, wherein the first curled part, the second curled part, the third curled part, and the fourth curled part are successively provided from outside to inside; and a gas sensitive material is coated outside the first curled part.

Preferably, in the gas sensor of the present invention, each of the first cantilever, the second cantilever, the third cantilever, and the fourth cantilever has a rectangular horizontal projection. Preferably, in the gas sensor of the present invention, each of the first cantilever, the second cantilever, the third cantilever, and the fourth cantilever has an isosceles trapezoidal horizontal projection, and widths of the first cantilever, the second cantilever, the third cantilever, and the fourth cantilever gradually decrease in the direction away from the base structure.

Preferably, in the gas sensor of the present invention, a first hole is provided on the first isolation film, and the first hole extends from an end of the second cantilever near the second base part to the second curled part.

Preferably, in the gas sensor of the present invention, a second hole is provided on the second isolation film, the second hole extends from the end of the fourth cantilever near the fourth base part to the fourth curled part, and the second hole corresponds to the first hole.

Preferably, in the gas sensor of the present invention, the third base part and the fourth base part are located on a side of the first through hole near the second cantilever; or, the third base part is located on a side of the first through hole away from the second cantilever, the third cantilever is located between the two first through holes, and a third through hole is provided on the fourth base part at a position corresponding to the first through hole.

Preferably, in the gas sensor of the present invention, thicknesses of the detecting electrode, the first isolation film, the heating resistor, and the second isolation film all range from 1000 Å to 10000 Å.

The present invention further provides a gas sensor array, the gas sensor array is composed of a plurality of the gas sensors described above.

The present invention further provides a method for manufacturing the gas sensor described above, including the following steps:
(1) selecting a silicon substrate and a sacrificial layer, wherein if a single side polished or a double side polished silicon wafer is used as the silicon substrate, a silicon oxide layer is formed as the sacrificial layer on the silicon substrate by a thermal oxidation method; or if a silicon-on-insulator (SOI) silicon wafer is used as the silicon substrate, a top silicon layer of the silicon-on-insulator (SOI) silicon wafer is used as the sacrificial layer;
(2) preparing the detecting electrode, wherein the detecting electrode is prepared by a lift-off process;
(3) preparing the first isolation film, wherein a silicon nitride layer is prepared by a plasma enhanced chemical vapor deposition, and then the isolation film is etched by a reactive ion etching or an ion beam etching to form the first through hole to expose the detecting electrode;
(4) preparing the heating resistor, wherein the heating resistor is prepared by the lift-off process;
(5) preparing a second isolation film, wherein a silicon nitride layer is prepared by the plasma enhanced chemical vapor deposition, and then the isolation film is etched by the reactive ion etching or the ion beam etching to expose the heating resistor;
(6) releasing a membrane, wherein firstly a complete etching is performed by the reactive ion etching or the ion beam etching to expose the silicon substrate and form a membrane releasing window, and then the sacrificial layer is etched by a wet etching process to form a cantilever structure having a curled structure; and
(7) loading a gas sensitive material, wherein an end part of the cantilever structure is coated with the gas sensitive material, and the first curled part is coated with the gas sensitive material after sintering.

Preferably, in the method of manufacturing the gas sensor according to the present invention, when the single side polished or double side polished silicon wafer is used as the silicon substrate, the thickness of the sacrificial layer is 1000 Å; when the SOI silicon wafer is used as the silicon substrate, the thickness of the top silicon of the SOI silicon wafer used as the sacrificial layer is 2 µm.

The advantages of the present invention are as follows.

The technical solution of the present invention uses a single-cantilever structure, where the effective region is provided at the end of the cantilever, and the power consumption of the sensor is reduced to 1 milliwatt by reducing the area of the effective region and reducing the number of cantilevers. The curled structure of the sensor allows to load more sensitive material than a planar structure having the same area, which is beneficial to improve the sensitivity and the stability of the sensor. The heating resistor is located inside the curled structure and is heated from the inside to the outside, which is beneficial to improve the heating efficiency and the temperature uniformity. The detecting electrode is located outside the curled structure, and directly detects the gas sensitive material attached to the outer side of the electrode, and the contact area with the gas is relatively large, which is beneficial to improve the sensitivity and the response speed. The curled single-cantilever sensor has a smaller size, higher integration degree, and the integration degree is an order of magnitude higher than that of the existing multi-cantilever-type structure.

The method of manufacturing the curled single-cantilever gas sensor provided by the present invention is simple in process, easy to position, can effectively improve the production efficiency, and is easier to load a composite structure of gas sensitive material.

DETAILED DESCRIPTION OF THE EMBODIMENTS

Figure 1:
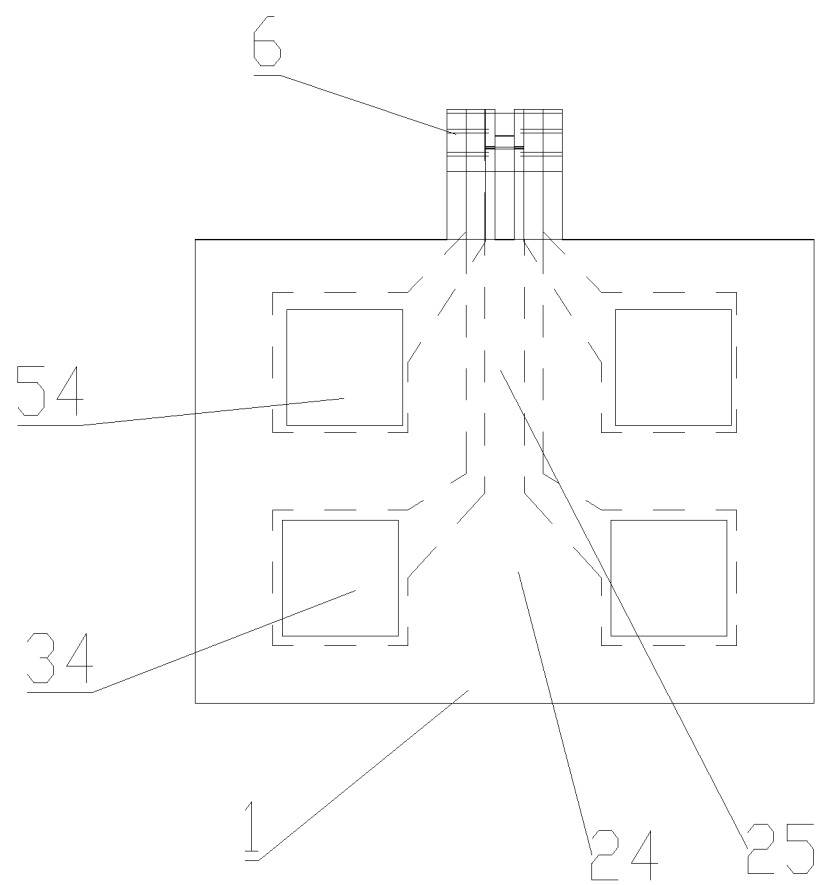
FIG. 1 is a structural schematic diagram of a gas sensor according to embodiment 1 of the present invention.
Figure 2:
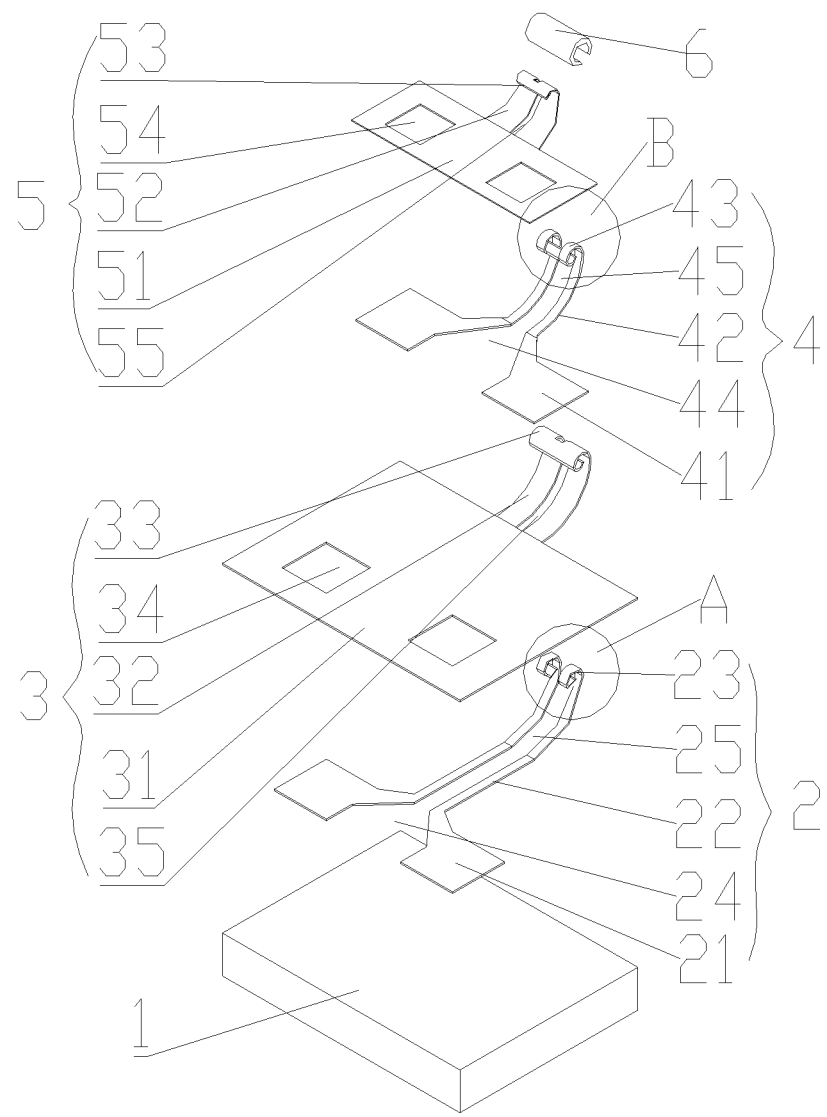
FIG. 2 is an exploded view of FIG. 1.
Figure 3:
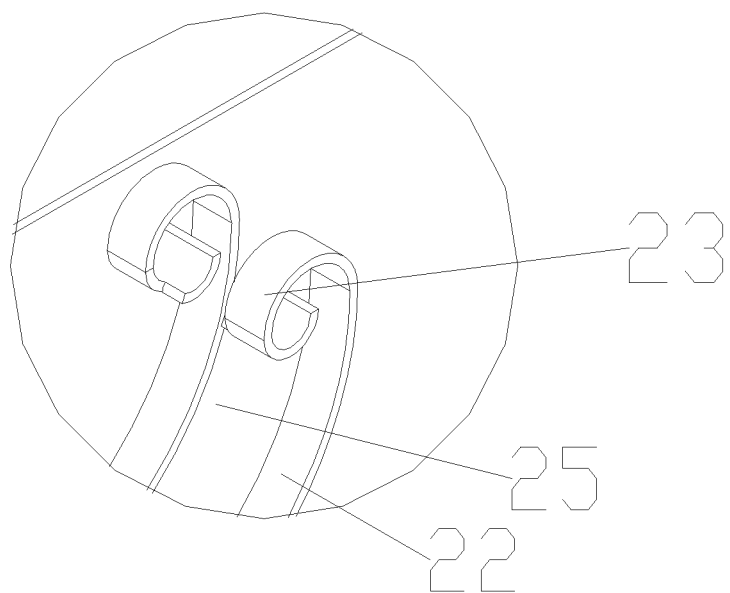
FIG. 3 is an enlarged schematic view of a portion A in FIG. 2.
Figure 4:
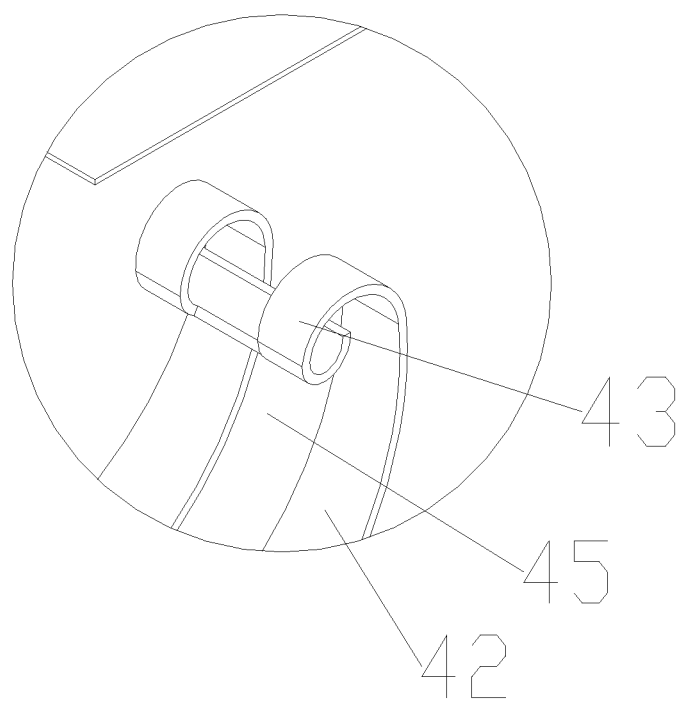
FIG. 4 is an enlarged schematic view of a portion B in FIG. 2.

In order to facilitate the understanding of the technical solution of the present invention by those skilled in the art, the technical solution of the present invention will be further described with reference to the drawings.

Embodiment 1

Referring to FIGS. 1-4, a gas sensor provided in the present embodiment includes the silicon substrate 1, the detecting electrode 2, the first isolation film 3, the heating resistor 4, the second isolation film 5, and the gas sensitive material 6.

The sensor has a base structure and a cantilever structure. Generally, the base structure is rectangular, and the cantilever structure is provided on a middle part of a long side of the base structure. Thus, the horizontal projection of the sensor is "T" shaped. The silicon substrate 1, the detecting electrode 2, the first isolation film 3, the heating resistor 4, and the second isolation film 5 are stacked successively from bottom to top. The specific structure of the sensor is as follows. Both of the upper and lower end surfaces of the silicon substrate 1 have a rectangular shape. Generally, the detecting electrode 2 is an electrode made of a noble metal material such as metal platinum or gold. The detecting electrode 2 includes the rectangular-shaped first base part 21, and a middle part of a long side of the first base part 21 is provided with the first cantilever 22 warped upward. The first curled part 23 is provided at a free end of the first cantilever 22. The first window 24 is provided on a side of the first base part 21 away from the first cantilever 22. The second window 25 is provided on the first cantilever 22, and the second window extends along the first cantilever 22 to the first curled part 23 and divides the first curled part 23. The second window 25 is interconnected with the first window 24 to divide the detecting electrode 2 into two parts. The first base part 21 is respectively provided with first lead wires (not shown in drawings) at a position on both sides of the first window 24.

The first isolation film 3 is a silicon nitride layer, configured to electrically isolate the detecting electrode 2 and the heating electrode 4. The first isolation film 3 includes the second base part 31, a middle part of a long side of the second base part 31 is provided with the second cantilever 32 warped upward. A free end of the second cantilever 32 is provided with the second curled part 33. The first through hole 34 is provided on the second base part 32 at a position corresponding to the first lead wire, and the first lead wire passes through the first through hole 34 and is exposed outside.

The heating resistor 4 is made of a metal material, generally, metal platinum, for heating the gas sensing material 6 to obtain the temperature required for operation. The heating resistor 4 includes the third base part 41, and a middle part of a long side of the third base part 41 is provided with the third cantilever 42 warped upward. A free end of the third cantilever 42 is provided with the third curled part 43. The third window 44 is provided on a side of the third base part 41 away from the third cantilever 42. The fourth window 45 is provided on the third cantilever 42. The fourth window 45 extends along the third cantilever 42 to the third curled part 43, and the fourth window 45 is interconnected with the third window 44. Second lead wires (not shown in drawings) are respectively provided on the third base part 41 at positions on both sides of the third window 44. The thickness of the heating resistor 4 is smaller than the thickness of the first isolation film 3, and the heating resistor 4 does not cover the first base part 21.

The second isolation film 5 is a silicon nitride layer which covers the heating resistor 4 to prevent the heating resistor 4 from being affected by the contact with the outside. The second isolation film includes the fourth base part 51, a middle part of a long side of the fourth base part 51 is provided with the fourth cantilever 52 warped upward, and a free end of the fourth cantilever 52 is provided with the fourth curled part 53. The second through hole 54 is provided in the fourth base part 51 at a position corresponding to the second lead wire, and the fourth base part 51 does not cover the first through hole 34.

The first base part 21, the second base part 31, the third base part 41, and the fourth base part 51 are correspondingly provided to form the base structure. The first cantilever 22, the second cantilever 32, the third cantilever 42, and the fourth cantilever 52 are correspondingly provided, and the first curled part 23, the second curled part 33, the third curled part 43, and the fourth curled part 53 are successively provided from outside to inside to form the cantilever structure.

The gas sensitive material 6 is made of a metal oxide semiconductor material, such as tin dioxide, zinc oxide or other oxides, at a nanometer scale. The gas sensitive material 6 is coated outside the first curled part 23, thereby being electrically connected to the detecting electrode 2. When the gas sensitive material 6 adsorbs a specific gas molecule, its electrical resistance changes, thereby achieving the purpose of detecting the gas.

The core part of the gas sensor is the cantilever structure having a curled structure, and the effective region for loading the gas sensitive material is merely at the end portion of the cantilever structure away from the base structure. On the one hand, the heat loss due to heat convection and heat radiation is reduced by reducing the area of the effective region. On the other hand, the cantilever structure is elongated and tilts up to avoid contact with the silicon substrate 1, thus greatly reducing the heat loss during heat conduction. This is why the sensor has an extremely low power consumption. Moreover, the heating resistor 4 is located inside the sensor, and the heating of the detecting electrode is more uniform while reducing the heat loss. The detecting electrode 2 is located outside the sensor, and the gas sensing material 6 is coated on the first curled part 23, so a larger contact area with the gas to be detected and the detecting electrode 2 is realized, and a faster response time can be obtained.

It should be noted that, in the present embodiment, the base structure is rectangular and the cantilever structure is provided on the middle part of the long side of the rectangular base structure. The present invention is, however, not strictly limited thereto. In the actual production process, the specific shape of the base structure and the setting position of the cantilever structure are configured as needed.

In the present embodiment, each of the first cantilever 22, the second cantilever 32, the third cantilever 42, and the fourth cantilever 52 has a rectangular horizontal projection.

Further, the first hole 35 is provided on the first isolation film 3, and the first hole 35 extends from an end of the second cantilever 32 near the second base part 31 to the second curled part 33. The second hole 55 is provided on the second isolation film 5, and the second hole 55 extends from one end of the fourth cantilever 52 near the fourth base part 51 to the fourth curled part 53. Only the first hole 35 is provided on the sensor, only the second hole 55 is provided on the sensor, or both of the first hole 35 and the second hole 55 are provided on the sensor. It should be noted that the positions of the first hole 35, the second hole 55, the second window 25, and the fourth window 45 should be set correspondingly. The heat loss during heat conduction is further reduced by providing the elongated first hole 35 and/or second hole 55.

In the present embodiment, the third base part 41 and the fourth base part 51 are located on the side of the first through hole 34 near the second cantilever 32.

In addition, the thicknesses of the detecting electrode 2, the first isolation film 3, the heating resistor 4, and the second isolation film 5 described in the present embodiment all range from 1000 Å to 10000 Å.

In the present embodiment, the first window 24 may be configured to have a symmetrical structure, and the detecting electrode 2 is divided into two symmetrical parts by the first window 24 and the second window 25. The third window 44 is of a symmetrical structure, and the heating resistor 4 is formed as a symmetrical structure by the third window 44 and the fourth window 45. It should be noted that, in actual production, the first window 24 and the third window 44 may further be of an asymmetrical structure, and the detecting electrode 2 and the heating resistor 4 are of asymmetric structures as well, according to requirements.

Embodiment 2

Figure 5:
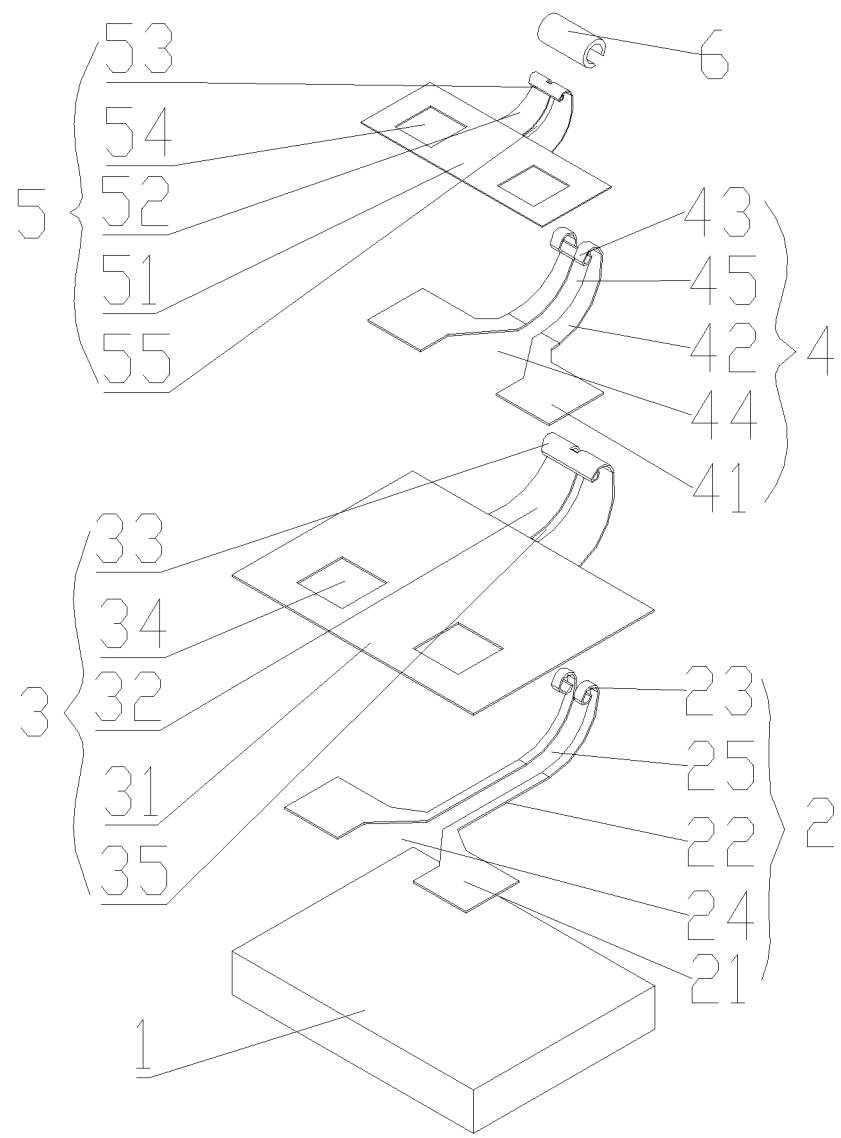
FIG. 5 is an exploded view of a gas sensor according to embodiment 2 of the present invention.

Referring to FIG. 5, the difference between the present embodiment and embodiment 1 is that, each of the first cantilever 22, the second cantilever 32, the third cantilever 42, and the fourth cantilever 52 has an isosceles trapezoidal horizontal projection. The widths of the first cantilever 22, the second cantilever 32, the third cantilever 42, and the fourth cantilever 52 gradually decrease in a direction away from the base structure. By increasing the connection width of the cantilever structure and the base structure, the characteristic of low power consumption of the single-cantilever structure is maintained, while the mechanical strength of the whole sensor is improved.

Embodiment 3

Figure 6:
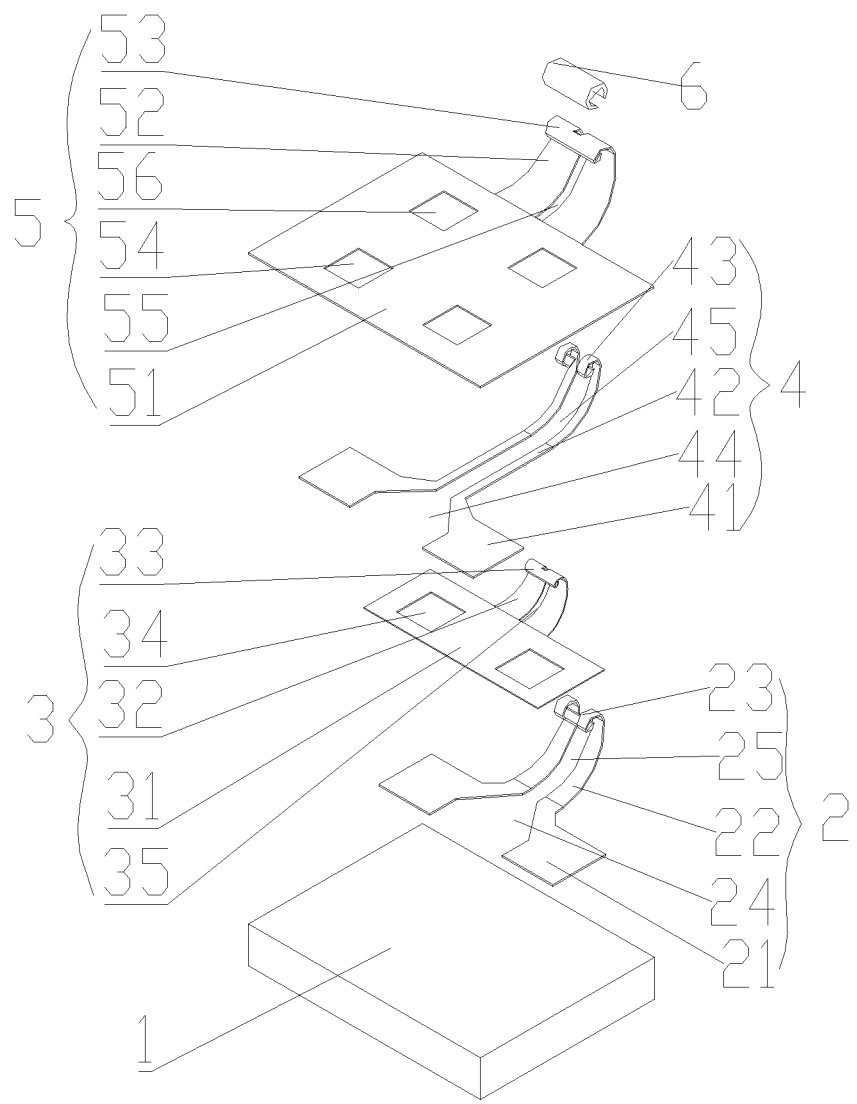
FIG. 6 is an exploded view of a gas sensor according to embodiment 3 of the present invention.

Referring to FIG. 6, the difference between the present embodiment and embodiment 2 is that, the third base part 41 is located on a side of the first through hole 34 away from the second cantilever 32. The third cantilever 42 is located between the two first through holes 34. A third through hole 56 is provided on the fourth base part 51 at the position corresponding to the first through hole 34 for the first lead wire to pass through.

Embodiment 4

Figure 7:
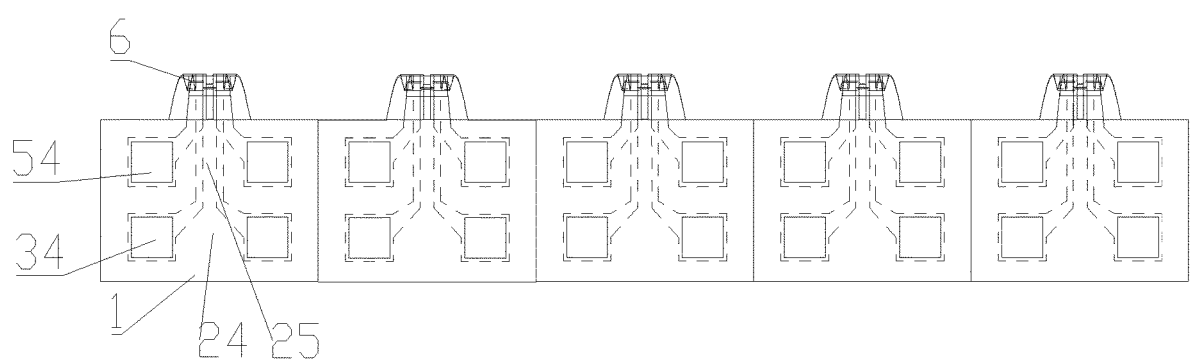
FIG. 7 is a structural schematic diagram of a gas sensor array according to embodiment 4 of the present invention.

In odor recognition applications, it is often necessary to integrate a large number of sensors to work together. Owing to the unique structure of the single cantilever type sensors having the curled structures described in embodiments 1 to 3, it is easy to realize the integration of multiple sensors to form a sensor array. As shown in FIG. 7, the present embodiment provides a sensor array which is formed by the above-mentioned single cantilever type sensors having a curled structure, wherein the cantilever structures of the sensors are all located on the same side of the base structure. Of course, the cantilever structures of the sensors may further be distributed on both sides of the base structure or in other arrangements as needed.

Embodiment 5

The present embodiment provides a method for manufacturing the gas sensor of embodiments 1-4, including the following steps:
(1) selecting an n-type single side polished (100) silicon wafer as the substrate, and forming a silicon oxide layer having a thickness of 1000 Å as a sacrificial layer by a thermal oxidation method;
(2) preparing the detecting electrode 2: preparing a gold electrode with a thickness of 1000 Å by a lift-off process;
(3) preparing the first isolation film 3: preparing a silicon nitride layer with a layer thickness of 2000 Å by a plasma enhanced chemical vapor deposition; and then etching the isolation film by a reactive ion etching or ion beam etching to form the first through hole 34 to expose the detecting electrode 2;
(4) preparing the heating resistor 4: preparing a heating resistor wire with a thickness of 1000 Å made of a platinum resistor by the lift-off process;
(5) preparing the second isolation film 5: preparing a silicon nitride layer having a layer thickness of 1000 Å by the plasma enhanced chemical vapor deposition; then etching the isolation film by the reactive ion etching or ion beam etching to expose the heating resistor 4;
(6) releasing the membrane: firstly performing a complete etching by the reactive ion etching or ion beam etching to expose the silicon substrate 1 and form a film releasing window, and then etching the sacrificial layer by a wet etching process; due to the tensile stress of the silicon nitride layer, the cantilever structure tilts up and the free end thereof is curved; and
(7) loading the gas sensitive material 6: dipping the end part of the cantilever structure with a tin dioxide gas sensitive material and sintering to coat the first curled part 23 with the tin dioxide gas sensitive material, thereby obtaining a curled single-cantilever gas sensor, and then setting the first lead wire and the second lead wire at the corresponding positions.

It should be noted that, in the present embodiment, the silicon substrate 1 may also be a double side polished silicon wafer, and the crystal orientation thereof is not strictly limited as well. The thicknesses of the detecting electrode 2, the first isolation film 3, the heating resistor 4, and the second isolation film 5 are adjusted within the range of 1000 Å to 10000 Å as needed.

Embodiment 6

The present embodiment provides a method for manufacturing the gas sensor of embodiments 1-4, including the following steps:
(1) selecting an SOI silicon wafer as the substrate, wherein the top of the SOI silicon wafer having a thickness of 2 μm is used as a sacrificial layer;
(2) preparing the detecting electrode 2: preparing a gold electrode with a thickness of 1000 Å by a lift-off process;
(3) preparing the first isolation film 3: preparing a silicon nitride layer with a layer thickness of 4000 Å by a plasma enhanced chemical vapor deposition; and then etching the isolation film by a reactive ion etching or ion beam etching to form the first through hole 34 to expose the detecting electrode 2;
(4) preparing the heating resistor 4: preparing a heating resistor wire with a thickness of 1000 Å made of a platinum resistor by the lift-off process;
(5) preparing the second isolation film 5: preparing a silicon nitride layer having a layer thickness of 1000 Å by the plasma enhanced chemical vapor deposition; then etching the isolation film by the reactive ion etching or ion beam etching to expose the heating resistor 4;
(6) releasing the membrane: firstly performing a complete etching by the reactive ion etching or ion beam etching to expose the silicon substrate 1 to form a membrane releasing window, and then etching the sacrificial layer by a wet etching process; due to the tensile stress of the silicon nitride layer, the cantilever structure tilts up and the free end thereof is curved; and
(7) loading the gas sensitive material 6: dipping the end part of the cantilever structure with a trioxide gas sensitive material and sintering to coat the first curled part 23 with the tin dioxide gas sensitive material, thereby obtaining a curled single-cantilever gas sensor, and then setting the first lead wire and the second lead wire at the corresponding positions.

The method for manufacturing the sensor array by the sensors is basically the same as the method for manufacturing the gas sensor according to embodiments 5-6. It only needs to set the etching conditions in step (6), so that a sensor array is formed after the membrane is released, in which a plurality of base structures are successively connected, and each of the base structures is configured with a cantilever structure. Then, the end of each cantilever structure is dipped with the dioxide gas of the same or different formulations as needed to form the gas sensor array. The technical solution of the present invention has been described above with reference to the drawings and the embodiments. It is obvious that the specific implementation of the present invention is not limited to the above methods. All immaterial improvements that are based on the method, conception, and technical solution of the present invention, or the direct application of the conception and technical solution of the present invention in other occasions without any modification, should be considered as falling within the scope of the present invention.

What is claimed is:

1. A gas sensor having a base structure and a cantilever structure, comprising the following parts that are successively stacked:
   a silicon substrate;
   a detecting electrode, wherein the detecting electrode comprises a first base part, one side of the first base part is provided with a first cantilever warped upward, and a free end of the first cantilever is provided with a first curled part; a first window is provided on a side of the first base part away from the first cantilever, a second window is provided on the first cantilever, the second window extends along the first cantilever to the first curled part, and the first curled part is divided by the second window; the second window is interconnected with the first window, and the detecting electrode is divided into two parts by the first window and the second window; first lead wires are respectively provided on the first base part at positions on both sides of the first window;
   a first isolation film, wherein the first isolation film is a silicon nitride layer and comprises a second base part, one side of the second base part is provided with a second cantilever warped upward, and the free end of the second cantilever is provided with a second curled part; a first through hole is provided on the second base part at positions corresponding to the first lead wires, and the first lead wires pass through the corresponding first through hole and is exposed outside;
   a heating resistor, wherein the heating resistor comprises a third base part, one side of the third base part is provided with a third cantilever warped upward, and a free end of the third cantilever is provided with a third curled part; a third window is provided on a side of the third base part away from the third cantilever, a fourth window is provided on the third cantilever, the fourth window extends along the third cantilever to the third curled part, and the fourth window is interconnected with the third window; second lead wires are respectively provided on the third base part at positions on both sides of the third window; the thickness of the heating resistor is smaller than the thickness of the first isolation film, and the heating resistor does not cover the first base part; and
   a second isolation film, wherein the second isolation film is a silicon nitride layer and comprises a fourth base part, one side of the fourth base part is provided with a fourth cantilever warped upward, and a free end of the fourth cantilever is provided with a fourth curled part; a second through hole is provided at the fourth base part at positions corresponding to the second lead wires; and the fourth base part does not cover the first through hole;
   wherein, the first base part, the second base part, the third base part, and the fourth base part form the base structure; the first cantilever, the second cantilever, the third cantilever, and the fourth cantilever form the cantilever structure, wherein the first curled part, the second curled part, the third curled part, and the fourth curled part are successively provided from outside to inside; and
   a gas sensitive material is covered outside the first curled part.

2. The gas sensor of claim 1, wherein, each of the first cantilever, the second cantilever, the third cantilever, and the fourth cantilever has a rectangular horizontal projection.

3. The gas sensor of claim 2, wherein, a first hole is provided on the first isolation film, and the first hole extends from an end of the second cantilever to the second curled part.

4. The gas sensor of claim 1, wherein, each of the first cantilever, the second cantilever, the third cantilever, and the fourth cantilever has an isosceles trapezoidal horizontal projection, and widths of the first cantilever, the second cantilever, the third cantilever, and the fourth cantilever decrease in a direction away from the base structure.

5. The gas sensor of claim 4, wherein, a first hole is provided on the first isolation film, and the first hole extends from an end of the second cantilever to the second curled part.

6. The gas sensor of claim 1, wherein, a first hole is provided on the first isolation film, and the first hole extends from an end of the second cantilever to the second curled part.

7. The gas sensor of claim 6, wherein, a second hole is provided on the second isolation film, the second hole extends from an end of the fourth cantilever to the fourth curled part, and the second hole corresponds to the first hole.

8. The gas sensor of claim 1, wherein, the third base part and the fourth base part are located on a side of the first through hole and between the first through hole and the second cantilever; or, the third base part is located on a side of the first through hole away from the second cantilever; a third through hole is provided on the fourth base part at a position corresponding to the first through hole; and the third cantilever is located between two first through holes.

9. The gas sensor of claim 1, wherein, thicknesses of the detecting electrode, the first isolation film, the heating resistor, and the second isolation film all range from 1000 Å to 10000 Å.

10. A gas sensor array, wherein the gas sensor array is composed of a plurality of the gas sensors of claim 1.

11. The gas sensor array of claim 10, wherein, each of the first cantilever, the second cantilever, the third cantilever, and the fourth cantilever has a rectangular horizontal projection.

12. The gas sensor array of claim 10, wherein, each of the first cantilever, the second cantilever, the third cantilever, and the fourth cantilever has an isosceles trapezoidal horizontal projection, and widths of the cantilever, the second cantilever, the third cantilever, and the fourth cantilever decrease in a direction away from the base structure.

13. The gas sensor array of claim 10, wherein, a first hole is provided on the first isolation film, and the first hole extends from an end of the second cantilever to the second curled part.

14. The gas sensor array of claim 13, wherein, a second hole is provided on the second isolation film, the second hole extends from an end of the fourth cantilever to the fourth curled part, and the second hole corresponds to the first hole.

15. The gas sensor array of claim 10, wherein, the third base part and the fourth base part are located on a side of the first through hole and between the first through hole and the second cantilever; or, the third base part is located on a side of the first through hole away from the second cantilever; a third through hole is provided on the fourth base part at a position corresponding to the first through hole; and the third cantilever is located between two first through holes.

16. The gas sensor array of claim 10, wherein, thicknesses of the detecting electrode, the first isolation film, the heating resistor, and the second isolation film all range from 1000 Å to 10000 Å.

17. A method for manufacturing the gas sensor of claim 1, comprising the following steps:
    (1) selecting the silicon substrate and a sacrificial layer, wherein if a single side polished or double side polished silicon wafer is used as the silicon substrate, a silicon oxide layer is formed as the sacrificial layer on the silicon substrate by a thermal oxidation method; or if a silicon-on-insulator (SOI) silicon wafer is used as the silicon substrate, a top of the silicon-on-insulator silicon wafer is used as the sacrificial layer;
    (2) preparing the detecting electrode, wherein the detecting electrode is prepared by a lift-off process;
    (3) preparing the first isolation film, wherein the silicon nitride layer is prepared by plasma enhanced chemical vapor deposition, and then the isolation film is etched by a reactive ion etching or an ion beam etching to form the first through hole to expose the detecting electrode;
    (4) preparing the heating resistor, wherein the heating resistor is prepared by the lift-off process;
    (5) preparing the second isolation film, wherein the silicon nitride layer is prepared by plasma enhanced chemical vapor deposition, and then the isolation film is etched by reactive ion etching or ion beam etching to expose the heating resistor;
    (6) releasing a membrane, wherein firstly etching is performed by reactive ion etching or ion beam etching to expose the silicon substrate and form a membrane releasing window, and then the sacrificial layer is etched by a wet etching process to form the cantilever structure having a curled structure; and
    (7) loading the gas sensitive material, wherein an end part of the cantilever structure is coated with the gas sensitive material, the first curled part is coated with the gas sensitive material after sintering.

18. The method for manufacturing the gas sensor of claim 17, wherein, if the single side polished or double side polished silicon wafer is used as the substrate, a thickness of the sacrificial layer is 1000 Å; or if the SOI silicon wafer is used as the substrate, a thickness of the top of the SOI silicon wafer serves as the sacrificial layer is 2 μm.

19. The method of claim 17, wherein, the third base part and the fourth base part are located on a side of the first through hole and between the first through hole and the second cantilever; or, the third base part is located on a side of the first through hole away from the second cantilever; a third through hole is provided on the fourth base part at a position corresponding to the first through hole; and the third cantilever is located between two first through holes.

20. The method of claim 17, wherein, each of the first cantilever, the second cantilever, the third cantilever, and the fourth cantilever has an isosceles trapezoidal horizontal projection, and widths of the cantilever, the second cantilever, the third cantilever, and the fourth cantilever decrease in a direction away from the base structure.

* * * * *